United States Patent [19]
Abe

[11] Patent Number: 5,626,481
[45] Date of Patent: May 6, 1997

[54] STRUCTURE FOR ELECTRICAL CONNECTION OF ELECTRIC PART

[75] Inventor: Shunji Abe, Yokohama, Japan

[73] Assignee: Yamaichi Electronics Co., Ltd., Tokyo, Japan

[21] Appl. No.: 489,637

[22] Filed: Jun. 12, 1995

[51] Int. Cl.$^6$ ............................................. H01R 9/09
[52] U.S. Cl. ............................................. 439/73; 439/266
[58] Field of Search ............................... 439/70–73, 68, 439/266–270, 330, 525, 526, 259–265

[56] References Cited

U.S. PATENT DOCUMENTS

| | | |
|---|---|---|
| 4,824,389 | 4/1989 | Doyle et al. ........................ 439/72 |
| 5,035,629 | 7/1991 | Matsuoka .......................... 439/72 |
| 5,199,883 | 4/1993 | Uratsuji ............................. 439/72 |
| 5,244,396 | 9/1993 | Matsuoka .......................... 439/72 |

*Primary Examiner*—Hien Vu
*Attorney, Agent, or Firm*—Wenderoth, Lind & Ponack

[57] ABSTRACT

A structure for electrical connection of an electric part includes a contact probe retained in a through-hole formed in a base member such that the contact probe can be compressed into the through-hole in an axial direction of the through-hole and restored therefrom, and an intermediate contact member turnably supported by the base member through a cantilevered-arm interposed between the contact probe and a contactor of the electric part.

16 Claims, 7 Drawing Sheets

STRUCTURE FOR ELECTRICAL CONNECTION OF ELECTRIC PART

BACKGROUND OF THE INVENTION

1. Field of the Invention

This invention relates to a structure for electrical connection of an electric part, such as an IC, a wiring board, and the like.

2. Brief Description of the Related Art

As shown in FIG. 1, there is known a contact probe 1 constituted of a wire material entangled and formed into a rod-like configuration. In a conventional socket, this contact probe 1 is implanted in a through-hole 3 formed in an insulating substrate 2 and a contactor 5 of an IC 4 is caused to directly overlie and contact one end of the contact probe 1 in order to establish an electrical connection.

However, in the above-mentioned structure for electrical connection, since the IC contactor 5 is vertically descended merely to vertically compress the contact probe 1 along the axis of the through-hole, a sufficient wiping effect cannot be obtained with respect to the contact interface and as a result, a stable electrical connection is difficult to obtain.

Recently, as it has become increasingly necessary to arrange the IC contactors at very narrow pitches, the contact probes are also required to be made thinner and thinner and arranged at narrower pitches. However, in the above-mentioned structure for electrical connection in which the IC contactor is caused to directly overlie and contact the contact probe, the area of the contact probe is very limited and therefore, it is difficult to employ a zigzag arrangement of the contact probes in order to fulfill the increasing requirement for the narrower pitch arrangement.

On the other hand, the contact probe of the type in which the contact probe is compressed in the axial direction of the through-hole is convenient in that a stable physical contact position can be obtained because the contact probe is not one-sided sideways as in the case of a horizontal U-shaped contactor having a long stroke of a spring, and in that the signal line length is reduced to obtain a favorable characteristic with respect to a high frequency signal.

The present invention has been accomplished in view of the above-mentioned drawbacks inherent in the conventional devices.

SUMMARY OF THE INVENTION

It is, therefore, an object of the present invention to provide a structure for electrical connection of a given electric part, in which a favorable wiping effect can be obtained with respect to the surface of a contactor of the electric part.

Another object of the present invention is to provide a structure for electrical connection of a given electric part, in which a reliable electrical connection is ensured.

The foregoing has outlined some of the more pertinent objects of the present invention. These objects should be construed as being merely illustrative of some of the more prominent features and applications of the invention. Many other beneficial results can be obtained by applying the disclosed invention in a different manner or modifying the invention within the scope of the invention. Accordingly, other objects and a full understanding of the invention may be had by referring to the summary of the invention, the detailed description describing the preferred embodiment in addition to the scope of the invention defined by the claims taken in conjunction with the accompanying drawings.

According to the present invention, there is essentially provided, in order to achieve the above objects, a structure for electrical connection of an electric part, comprising a contact probe retained in a through-hole formed in a base member such that the contact probe can be compressed into the through-hole in an axial direction of the through-hole and restored therefrom; and an intermediate contact member turnably supported by the base member through a cantilevered-arm interposed between the contact probe and a contactor of the electric part.

The cantilevered-arm may include a pivotal support point disposed at a level lower than a contact level with respect to the electric part contactor. Also, the cantilevered arm may include a stopper for setting an upper limit for pivotal movement of the cantilevered arm. Further, the cantilevered arm may be constituted of a spring member. The contact probe may be constituted of a rod formed of entangled-wires.

According to the present invention, when the contactor of a given electric part represented by an IC is vertically descended to compress the contact probe, the intermediate contact member constituted of the cantilevered arm interposed between the contact probe and the electric part contactor is pivoted. As a result, the intermediate contact member is caused to slide on the surface of the electric part contactor. As a consequence, a favorable wiping effect can be provided. Also, the sliding amount can be freely set by the length of the cantilevered arm.

DETAILED DESCRIPTION OF THE EMBODIMENTS

Figure 1:
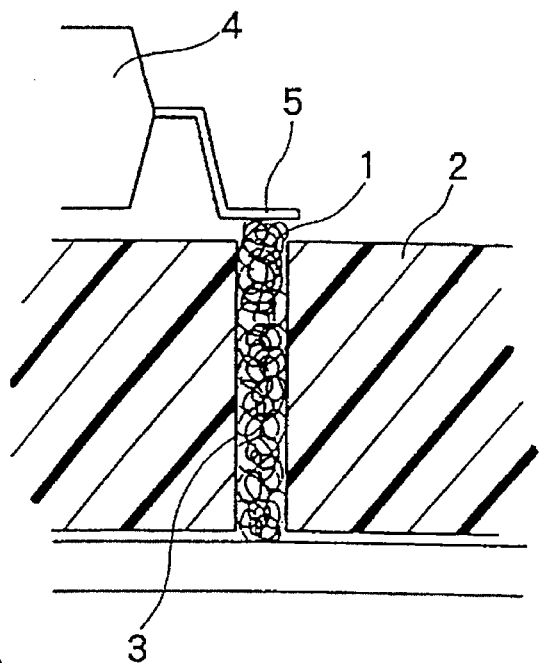
FIG. 1 is a sectional view showing an important portion of a structure for electrical connection between a contact probe and a contactor of a given electric part, according to the prior art.

Several embodiments of the present invention will now be described in detail with reference to FIGS. 2 to 8 of the accompanying drawings.

Reference numeral 11 denotes a contact probe. This contact probe 11 is retained in a through-hole 13 formed in a base member 12 formed of an insulative material. One end of the contact probe 11 is subjected to electrical connection or physical contact with a contactor 15 of an IC 14 or wiring board, whereas the other end thereof is subjected to electrical connection or physical contact with a contactor of another wiring board 36.

For example, both ends of the contact probe 11 are exposed from openings of both ends of the through-holes 13 so that the exposed ends are subjected to the electrical connection or physical contact. Also, the both ends of the contact probe 11 are provided with pressure bearing members, respectively. The pressure bearing members are integral with the contact probe 11 and formed of a part capable of being compressed and restored in the axial direction of the through-hole 13. The pressure bearing members are exposed from the through-hole 13 so that they are subjected to electrical connection or physical contact with the above-mentioned electric parts. Also, the contactor 15 of the electric part 14 is inserted into the through-hole 13 from both ends thereof so that the contactor 15 is physically contacted or connected to the contact probe 11 in the through-hole 13. A number of such through-holes 13 corresponding to the number of contactors on the electric part 14 are formed in the insulative base member 12. Each of the contact probes 11 is retained in each of the through-holes 13. In the alternative, an elongated hole is formed in the insulative base member 12 and an anisotropic conductive elastomer is retained in the elongated hole, so that a single conductive elastomer is physically contacted or connected to a plurality of electric part contactors 15.

As shown in FIGS. 2 to 5, the contact probe 11 herein employed is wire material entangled and formed into a rod-like configuration. That is, a single or a plurality of conductive wires are formed into a large number of entangled irregular loops by being bent many times so that a rod-like configuration, as a whole, is obtained. As a consequence, this contact probe 11 has a large number of bent portions of the wire material at opposite end faces thereof, and those bent portions serve as a large number of contact points to be physically contacted or connected to the contactors 15 of the electric part.

Figure 6:
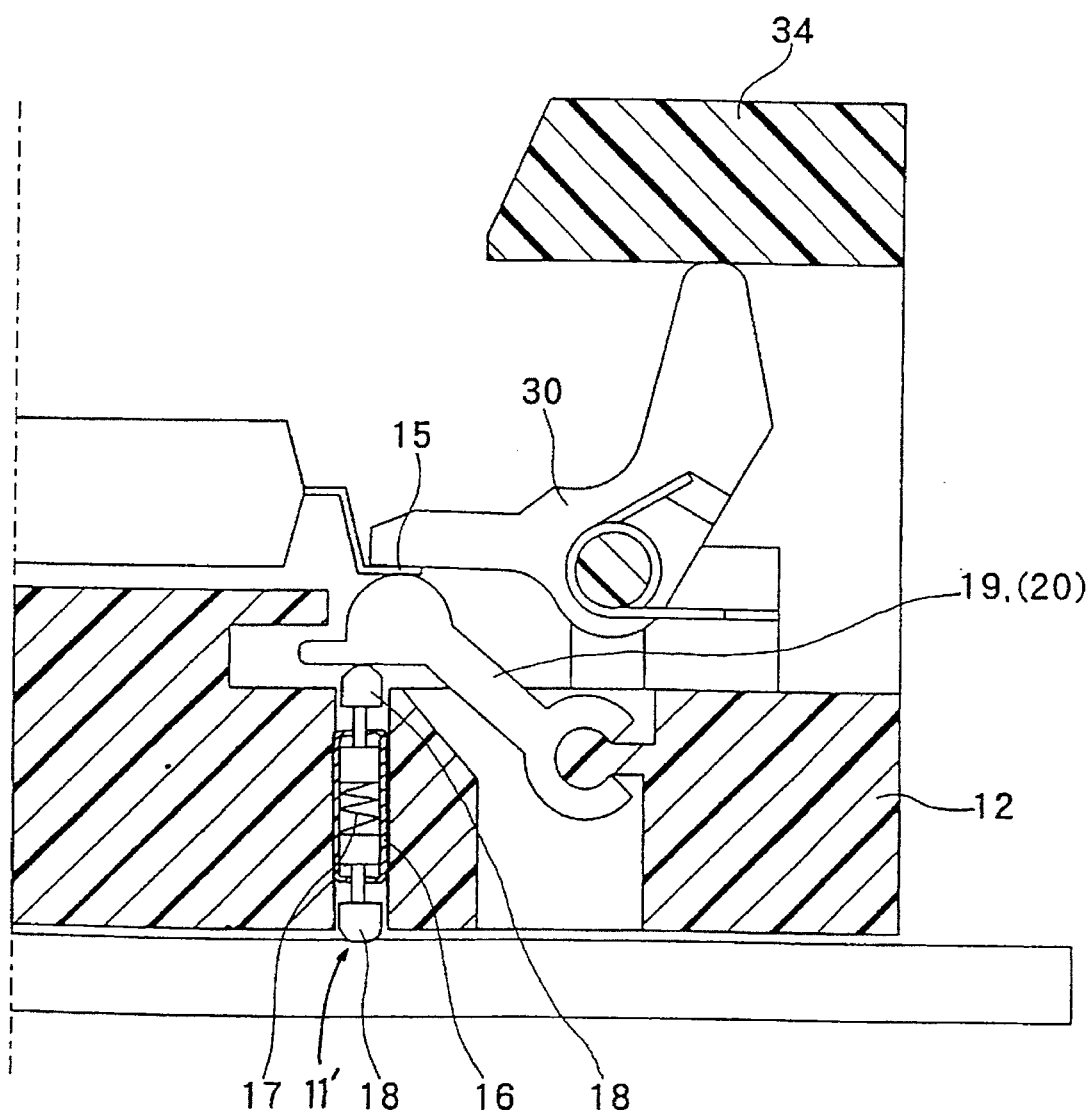
FIG. 6 is a sectional view showing an important portion of a structure for electrical connection between a contact probe and a contactor of a given electric part, according to another embodiment of the present invention, in which there is shown a state of the structure while a downwardly directed force is being applied to the contactor of the electric part.

In an example shown in FIG. 6, the contact probe 11' is constituted of a sleeve 16, a coil spring 17 received in the sleeve 16, and pressure bearing members 18 resiliently supported by the coil spring 17 such that the pressure bearing members 18 project from the opposite ends of the sleeve 16. Although not shown, a rod-like contact probe formed of anisotropic conductive rubber is retained in each hole 13.

An intermediate contact member 19 is interposed between the contact probe 11 and the contactor 15 of the electric part 14.

The intermediate contact member 19 is constituted of a cantilevered arm 20. One end of the cantilevered arm 20 is pivotably and displaceably supported by the base member 12, and the other end thereof is defined as a slide contact portion 22 which is pivotable about a pivotal support portion 21. The slide contact portion 22 is interposed between an upper end face of the contact probe 11 and a lower surface of a lower part of the contactor 15 of the electric part 14.

When the contact probe 11 is compressed through the slide contact portion 22 by the electric part contactor 15 being vertically lowered, the slide contact portion 22 is pivoted downwardly about the pivotal support portion of the cantilevered arm 20 and slid along the lower surface of the electric part contactor 15 to wipe the lower surface.

Figure 2:
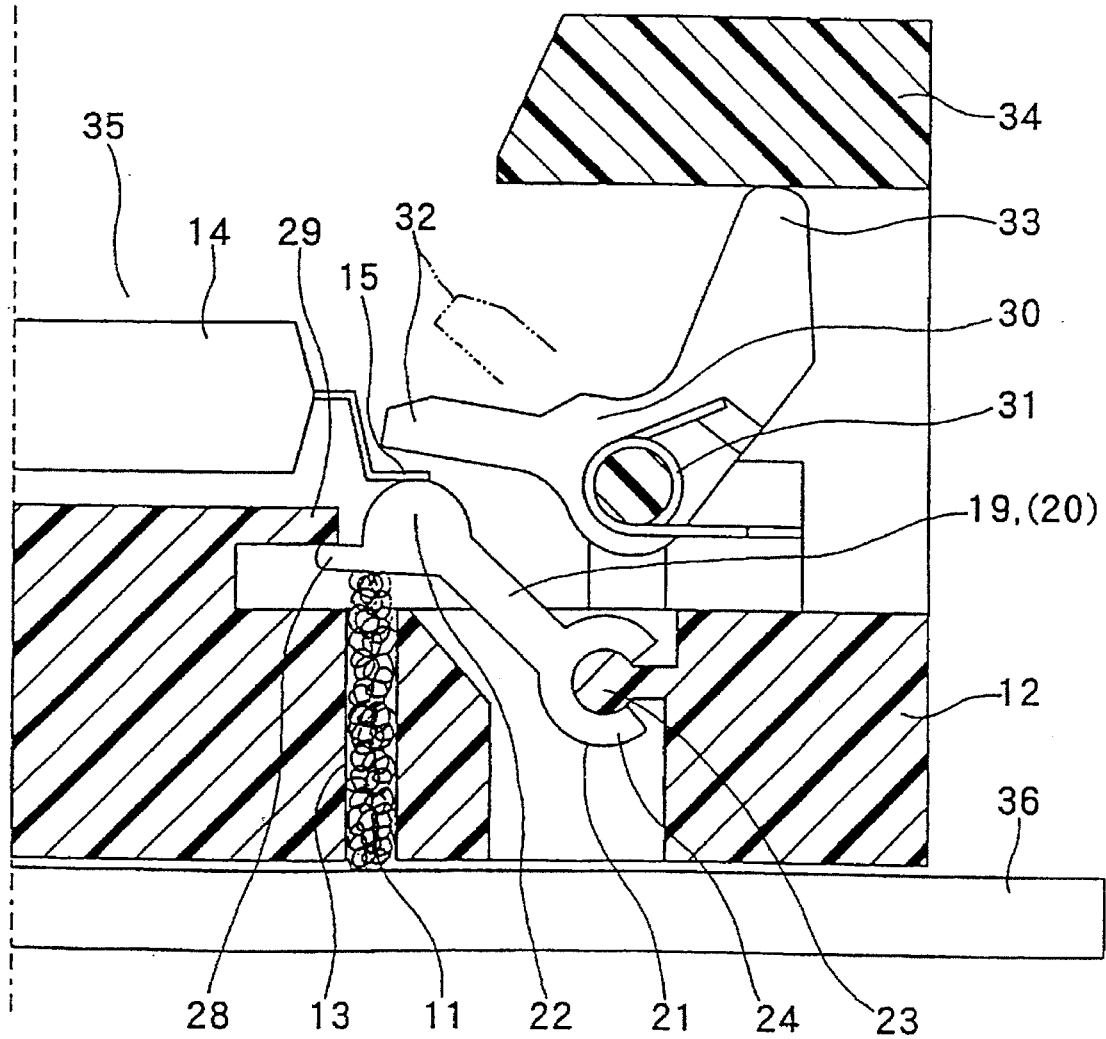
FIG. 2 is a sectional view showing an important portion of a structure for electrical connection between a contact probe and a contactor of a given electric part, according to one embodiment of the present invention, in which there is shown a state of the structure before a downwardly directed force is applied to the contactor of the electric part.
Figure 3:
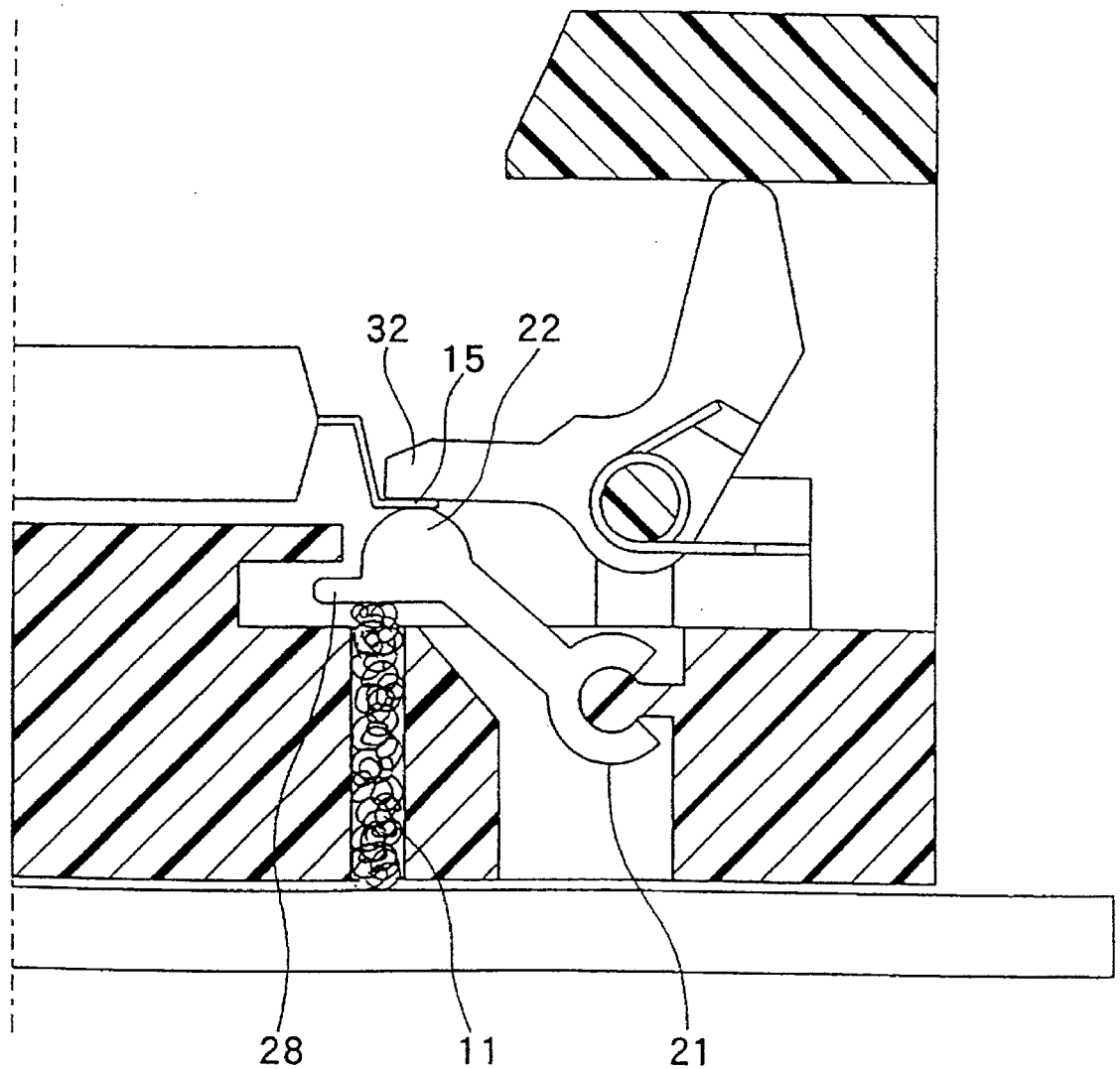
FIG. 3 is a sectional view showing an important portion of the structure for electrical connection between the contact probe and the contactor of the electric part, in which there is shown a state of the structure while the downwardly directed force is being applied to the contactor of the electric part.
Figure 5:
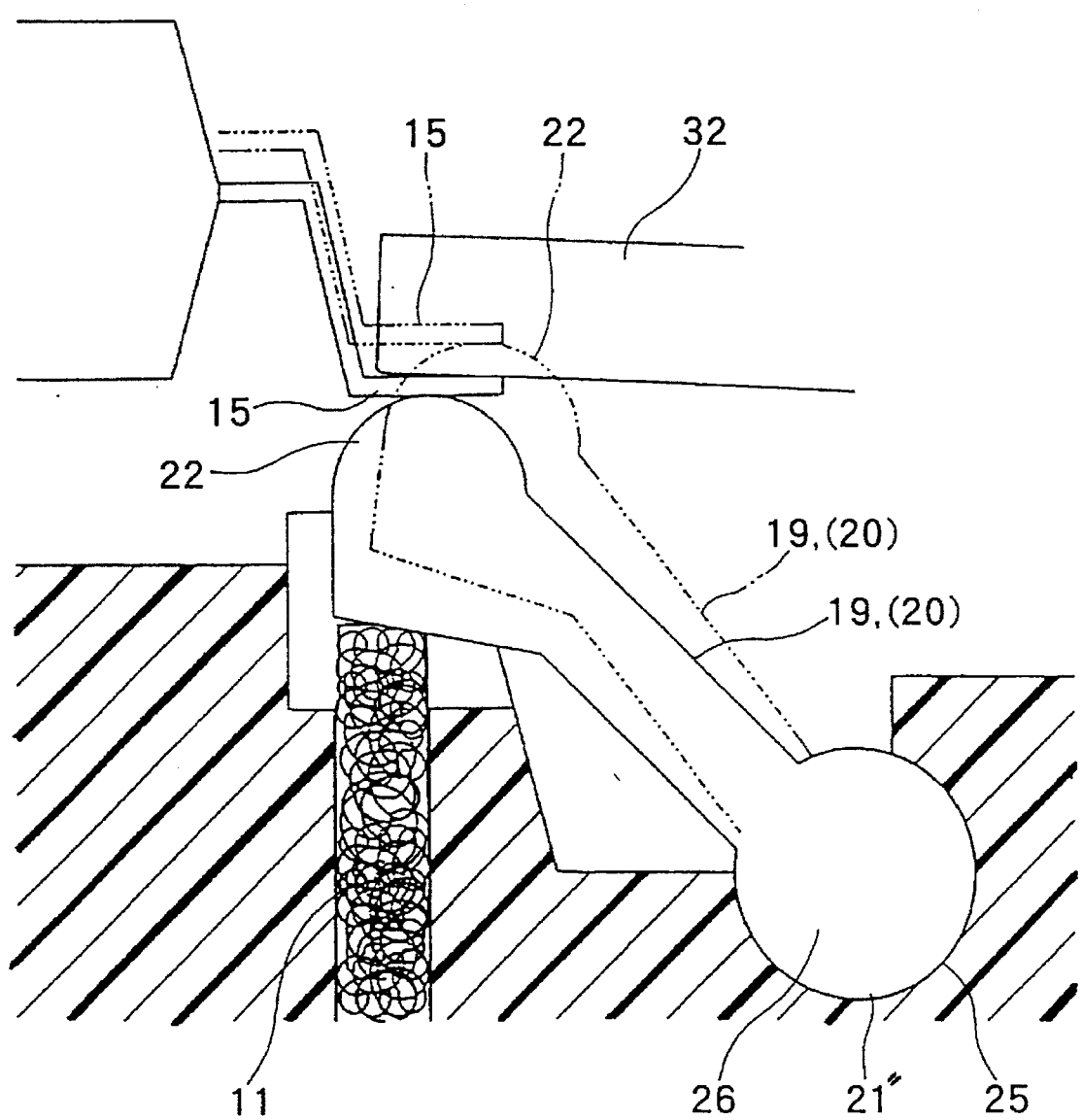
FIG. 5 is a sectional view of the important portion of the structure for the electrical connection between the contact probe and the contactor of the electric part, showing an operating state of an intermediate contact member in the above respective embodiments.

As shown in FIGS. 2, 3 and 5, the cantilevered arm 20 forming the intermediate contact member 19 is pivotally supported at one end thereof by the base member 12 through a hinge. As shown in FIGS. 2 and 3, this hinge is constituted, for example, of a male joint portion 23 having a circular configuration in section integral with the base member 12, and a sleeve-like female joint portion 24 slide fitted onto the joint 23. The sleeve-like joint portion 24 is formed on one end of the cantilevered arm 20. The cantilevered arm 20 is pivotably supported by the hinge which serves as the pivotal support portion 21.

Also, as shown in FIG. 5, the hinge can be constituted of a sleeve-like female joint portion 25 which is circular in section and is integral with the base member 12, and a male joint 26 which is circular in section and is slide fitted into the sleeve-like joint 25. The circular joint 26 is formed on one end of the cantilevered arm 20 to constitute a support portion 21".

Figure 4:
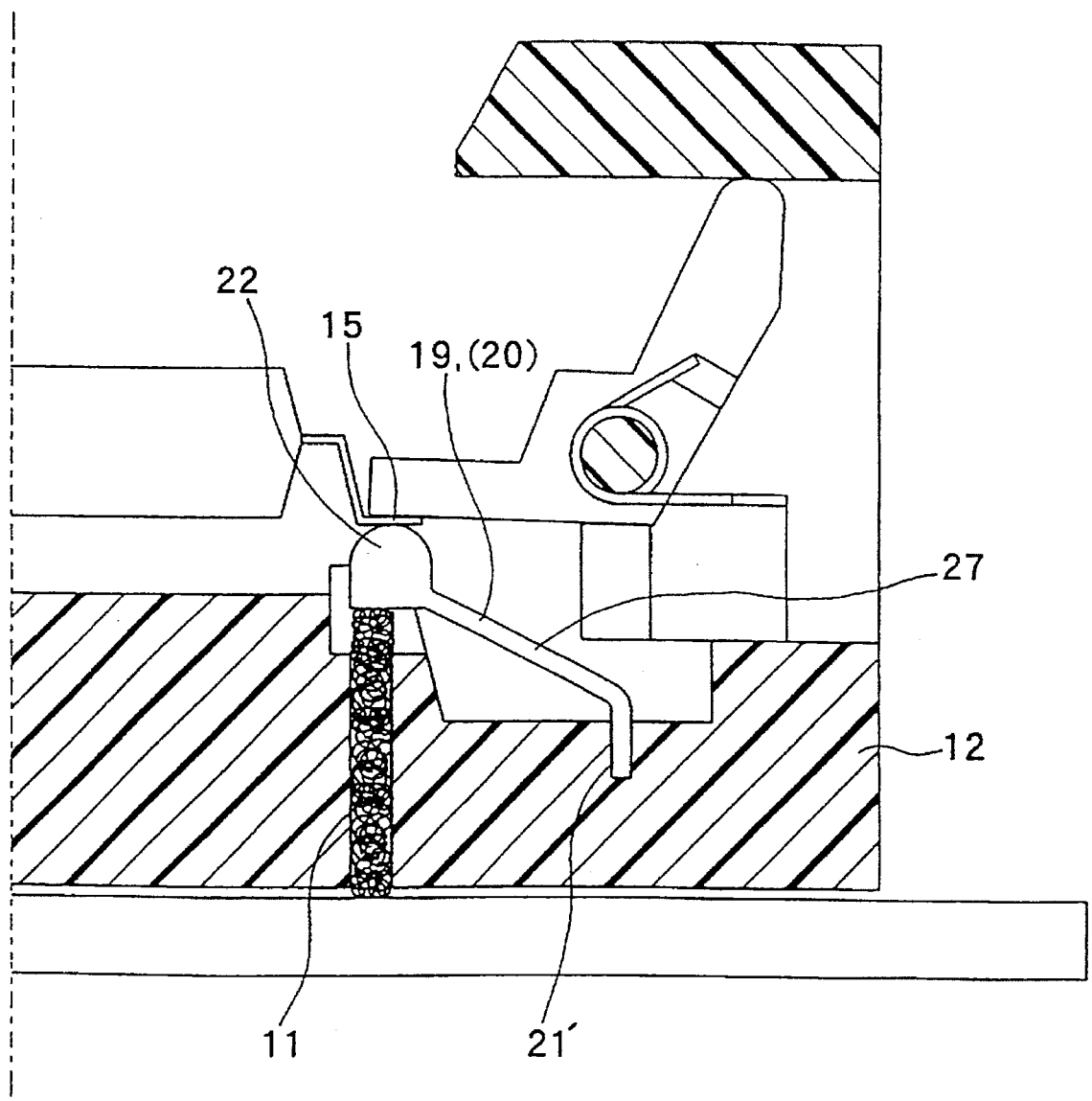
FIG. 4 is a sectional view showing an important portion of a structure for electrical connection between a contact probe and a contactor of a given electric part, according to another embodiment of the present invention, in which there is shown a state of the structure while a downwardly directed force is being applied to the contractor of the electric part.

Also, as another example, as shown in FIG. 4, the cantilevered arm 20 forming the intermediate contact member 19 is formed of a spring member 27. The spring member 27 is supported by the base member 12. A rigid slide contact portion 22 is formed on the other end of the spring member 27. This slide contact portion 22 is interposed between the contact probe 11 and the electric part contactor 15.

The slide contact portion 22 is pivoted about the support point as the cantilevered arm 20 constituted of a spring member is resiliently displaced upwardly and downwardly about the neighborhood of the support portion 21'. By this pivotal movement, the slide contact portion 22 slides on the surface of the contactor 15 of the electric part.

A pivotal support point (support portion 21, 21' or 21") of the cantilevered arm 20 forming the intermediate contact member 19 is located below the contact level with the contactor 15 of the electric part. That is, the pivotal support point is disposed outwardly or inwardly of the contact probe 11.

In FIGS. 2 and 3, as well as elsewhere, the slide contact portion 22 formed on a free end of the cantilevered arm 20 is interposed between the contact probe 11 and the electric part contactor 15. That is, the slide contact portion 22 is caused to contact the contact probe 11 at a position corresponding to the contact portion between the electric part contactor 15 and the slide contact portion 22.

Figure 7:
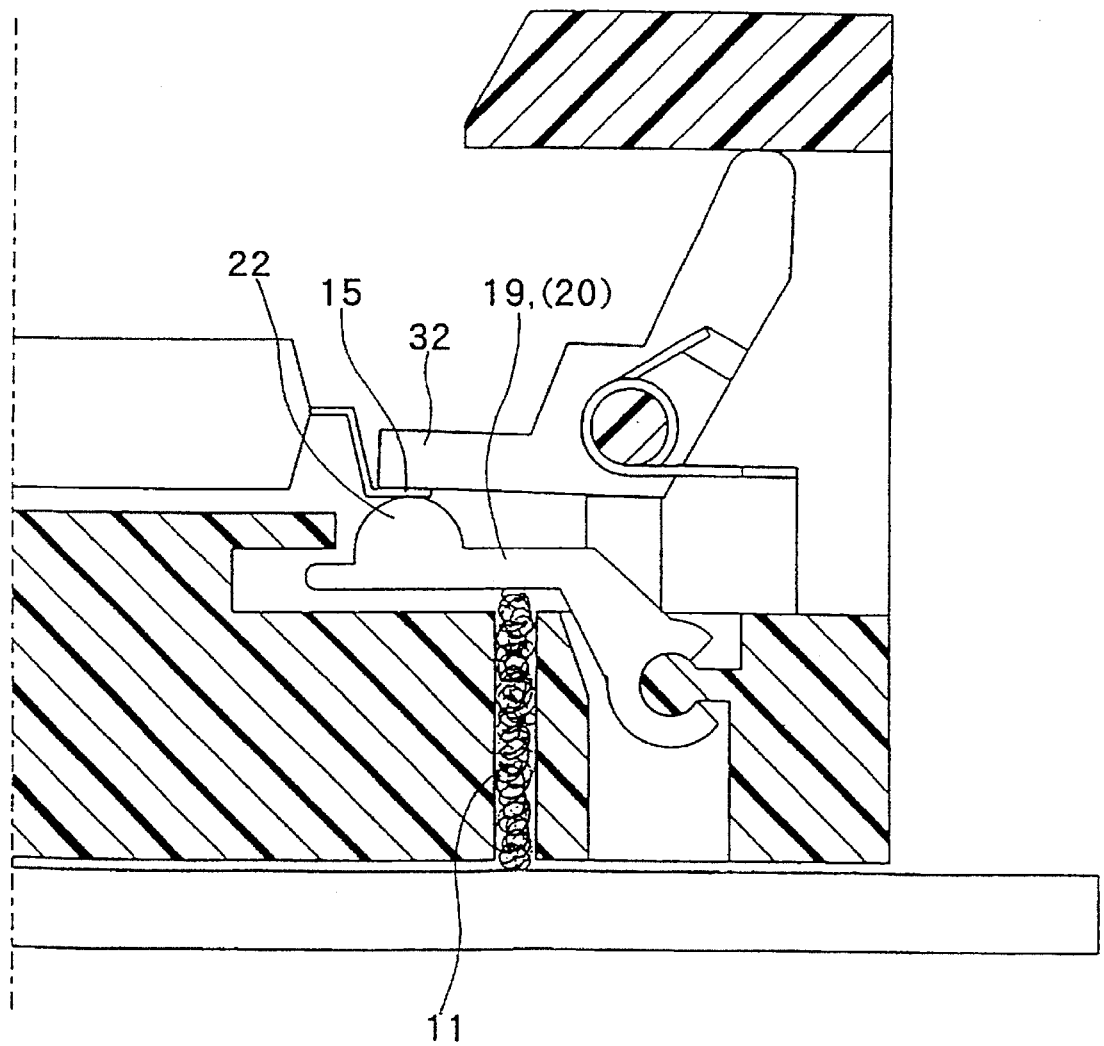
FIG. 7 is a side view of an important portion of a structure for electrical connection showing a state of electrical connection between a contact probe and an intermediate contact member, according to another embodiment of the present invention.

As shown in FIG. 7, the slide contact portion 22 is caused to contact the electric part contactor 15, and the contact probe 11 is allowed to contact the cantilevered arm 20 by selecting an appropriate position where the cantilevered arm 20 extends.

In other words, the contact probe 11 is disposed at the extension portion of the cantilevered arm 20 between the contact point of the electric part contactor 15 and the support portion 21 of the cantilevered arm 20.

Figure 8:
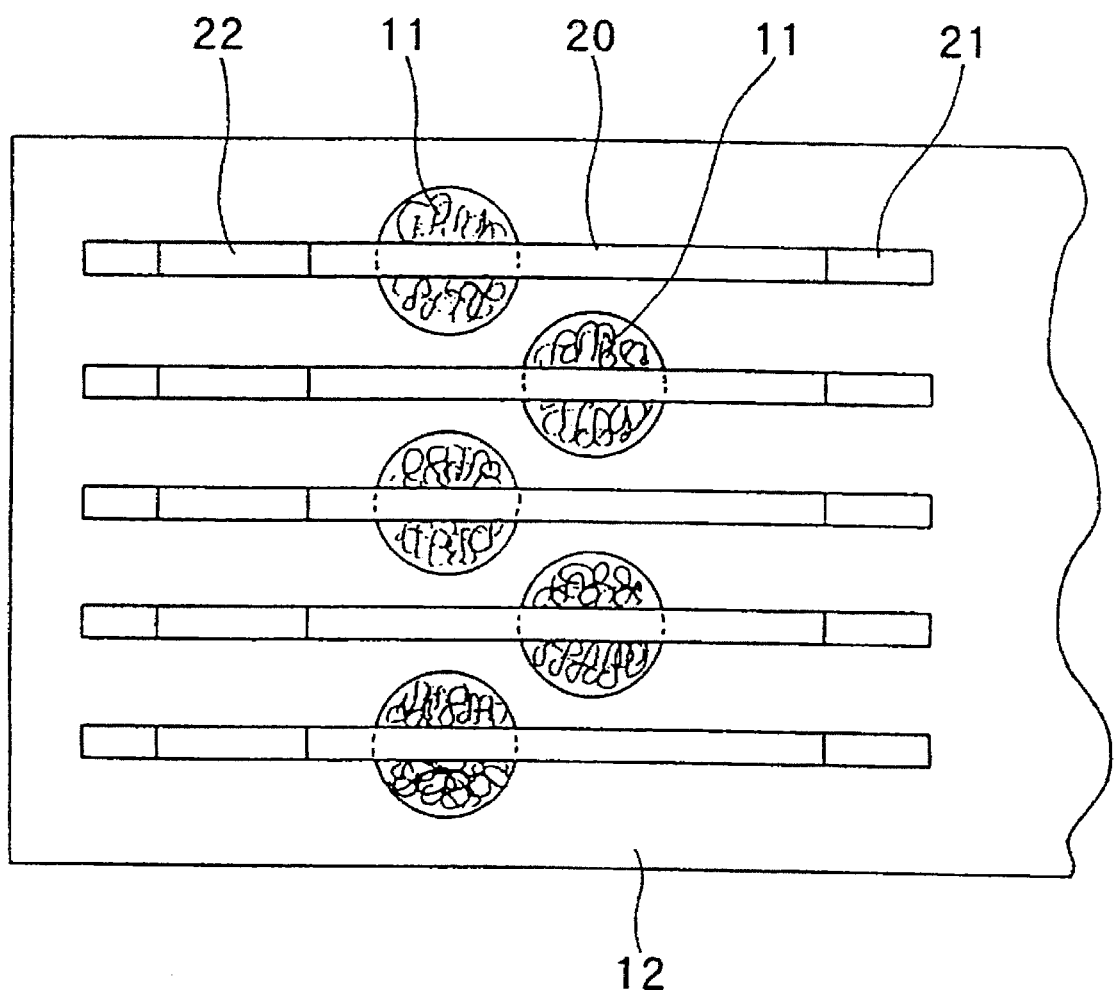
FIG. 8 is a plan view of an important portion of a structure for electrical connection schematically showing a pitch transforming state of a contact probe with respect to an intermediate contact member, according to another embodiment of the present invention.

Owing to the construction of the above embodiment, as shown in FIG. 8, the contact probes 11 can be arranged in a zigzag pattern.

Also, owing to the construction of the above embodiment, the contact probe 11 can be compressed with a reduced force due to the cantilevered arm 20 acting as a lever.

As a modified embodiment, as shown in FIGS. 2 and 3, as well as elsewhere, a stopper 28 is integrally formed on the cantilevered arm 20 forming the intermediate contact member 19. The stopper 28 is adapted to contact a limit portion 29 of the base member to set the upper limit of the pivotal movement.

As means for applying a downwardly directed force to the electric part contactor 15, a pressing member 30 constituted of a pivotable lever supported by the substrate 12 is provided. The pressing member 30 is resiliently held by a spring 31. The electric part contactor 15 is pressed downwardly by a pressing element 32 formed on one end of the pressing member 30, and the pressing member 30 is provided at the other end thereof with a pressure bearing element 33. A push-down force can be exerted against the pressure bearing element 33 by lowering a cover 34 disposed above the base member 12, such that the pressing element 32 is pivoted upwardly against the spring 31 to open an electric part receiving section 35 so that the electric part can be loaded or unloaded. When the push-down force caused by the cover 34 is removed, the pressing element 32 of the pressing member 30 is pivoted downwardly in accordance with the resilient force of the spring 31 to thereby push down the electric part contactor 15.

As a consequence, the contact probe 11 is compressed in the axial direction of the through-hole 13 through the intermediate contact member 19 which is constituted of the cantilevered arm 20, and a contact force is obtained by its restoring force. At the same time, the slide contact portion 22 slides on the surface of the electric part contactor 15 to cause a wiping action.

As means for exerting a downwardly directed force against the electric part contactor 15, the contactor 15 may be pushed down by a jig and without the provision of such actuator elements as the above-mentioned pressing member 30 and cover 34. Also, a push-down force may be exerted against the electric part contactor 15 by the cover 34. Also, a push-down force may be exerted against the electric part contactor 15 by operating the pressing member 30 either with the use of a jig or manually.

In the above embodiments, there is illustrated an IC package having gull-wing type leads obtained by bending the contactors 15 twice. However, the present invention is likewise applicable to an IC package of the type in which a conductive foil is formed on and along a lower surface of the electric part body, a flat type IC package in which leads are allowed to project horizontally sidewardly from the electric part body, and a J-bent type IC package in which leads extend in a J-shape toward the lower surface of the electric part body from its side surface.

According to the present invention, when the contact probe is compressed through the intermediate contact member by exerting a downwardly directed force against the contactor of a given electric part represented by an IC, the intermediate contact member constituted of a cantilevered arm disposed between the contact probe and the electric part contactor is pivoted. As a result, a middle part of the intermediate contact member is caused to slide on the surface of the electric part contactor. This sliding movement of the intermediate contact member provides a favorable wiping effect. As a consequence, a reliable contact can be obtained while enjoying the advantages which the contact probe can offer. Also, by setting the length of the cantilevered arm, the wiping effect can be adequately set.

It is to be understood that the form of the invention herewith shown and described is to be taken as the preferred embodiment of the same, and that various changes in the shape, size and arrangement of parts may be resorted to without departing from the spirit of the invention or the scope of the subjoined claims.

What is claimed is:

1. A structure for use in electrical connection of an electric part, said structure comprising:

a base member having a through-hole formed therein;

a longitudinally compressible contact probe mounted in said through-hole of said base member so as to protrude upwardly therefrom when in an uncompressed state;

an intermediate contact member having a first extreme end and a second extreme end, said first extreme end constituting a fulcrum and being rotatably attached to and supported by said base member such that said intermediate contact member is pivotable about said first extreme end between a rest position in which said second extreme end is in an upper position and a compressing position in which said second extreme end is in a lowered position;

wherein said intermediate contact member includes a contact point at which said intermediate contact member contacts a protruding end of said compressible contact probe; and wherein said fulcrum at said first extreme end of said intermediate contact member is disposed at a level below a level of said contact point when said intermediate contact member is in either said rest position or said compressing position.

2. A structure as recited in claim 1, wherein said intermediate contact member constitutes a means for longitudinally compressing said contact probe upon being pivoted from said rest position to said compressing position; and said contact probe is longitudinally resilient so as to constitute a means for restoring said intermediate contact member to said rest position from said compressing position.

3. A structure as recited in claim 1, wherein an entirety of said intermediate contact member is pivotable about said fulcrum.

4. A structure as recited in claim 1, wherein said intermediate contact member includes a stopper for setting an upper limit for pivotal movement of said intermediate contact member.

5. A structure as recited in claim 1, wherein said intermediate contact member comprises a spring member.

6. A structure as recited in claim 1, wherein said contact probe comprises a rod formed of entangled wires.

7. A structure as recited in claim 1, wherein said contact point is located adjacent said second extreme end of said intermediate contact member.

8. A structure as recited in claim 1, wherein said contact point is located intermediate said first and second extreme ends of said intermediate contact member.

9. A structure as recited in claim 1, wherein
said contact point is spaced apart from said fulcrum.

10. A structure for use in electrical connection of an electric part, said structure comprising:
- a base member having a through-hole formed therein;
- a longitudinally compressible contact probe mounted in said through-hole of said base member so as to protrude upwardly therefrom when in an uncompressed state;
- an intermediate contact member having a first extreme end and a second extreme end, said first extreme end constituting a fulcrum and being rotatably supported by said base member such that said intermediate contact member is pivotable about said first extreme end between a rest position in which said second extreme end is in an upper position and a compressing position in which said second extreme end is in a lowered position;
- wherein said intermediate contact member includes a contact point at which said intermediate contact member contacts a protruding end of said compressible contact probe; and
- wherein said contact point is located at said second extreme end, such that said contact point is spaced apart from said fulcrum.

11. A structure as recited in claim 10, wherein
said fulcrum at said second extreme end of said intermediate contact member is disposed at a level below a level of said contact point.

12. A structure as recited in claim 10, wherein
said intermediate contact member constitutes a means for longitudinally compressing said contact probe upon being pivoted from said rest position to said compressing position; and
said contact probe is longitudinally resilient so as to constitute a means for restoring said intermediate contact member to said rest position from said compressing position.

13. A structure as recited in claim 10, wherein
an entirety of said intermediate contact member is pivotable about said fulcrum.

14. A structure as recited in claim 10, wherein
said intermediate contact member includes a stopper for setting an upper limit for pivotal movement of said intermediate contact member.

15. A structure as recited in claim 10, wherein
said intermediate contact member comprises a spring member.

16. A structure as recited in claim 10, wherein
said contact probe comprises a rod formed of entangled wires.

* * * * *